United States Patent
Kim et al.

(10) Patent No.: US 9,004,132 B2
(45) Date of Patent: Apr. 14, 2015

(54) APPARATUS AND METHOD FOR MANUFACTURING CAMERA MODULE

(71) Applicant: Samsung Electro-Mechanics Co., Ltd., Suwon (KR)

(72) Inventors: Sang Jin Kim, Suwon (KR); Byung Jae Kim, Suwon (KR); Sung Jae Lee, Suwon (KR); Seung Hee Cho, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 114 days.

(21) Appl. No.: 13/801,062

(22) Filed: Mar. 13, 2013

(65) Prior Publication Data

US 2013/0299081 A1 Nov. 14, 2013

(30) Foreign Application Priority Data

May 14, 2012 (KR) .......................... 10-2012-0050831

(51) Int. Cl.
*H05K 13/04* (2006.01)

(52) U.S. Cl.
CPC .................................. *H05K 13/0413* (2013.01)

(58) Field of Classification Search
CPC .... H05K 13/0413; H04N 5/232; H04N 5/225
USPC ....................................................... 156/379.8
See application file for complete search history.

(56) References Cited

U.S. PATENT DOCUMENTS

2009/0298235 A1* 12/2009 Kostiew et al. ............... 438/118

FOREIGN PATENT DOCUMENTS

| JP | 2006-13073 | 1/2006 |
| JP | 2007-294793 | 11/2007 |
| KR | 10-2008-0016071 | 2/2008 |
| KR | 10-2008-0032507 | 4/2008 |

OTHER PUBLICATIONS

Japanese Office Action issued Dec. 17, 2013 in corresponding Japanese Patent Application No. 2013-078265.
Korean Notice of Allowance issued Jan. 24, 2014 in corresponding Korean Patent Application No. 10-2012-0050831.

* cited by examiner

*Primary Examiner* — Daniel McNally

(57) ABSTRACT

An apparatus and a method for manufacturing a camera module. The method for manufacturing a camera module includes: picking up an image sensor by the bonding head and mounting the image sensor on a PCB; compensating for a tilt deviation between the PCB and the image sensor by the gyro unit of the PCB support unit simultaneously when the image sensor is mounted on the PCB; applying heat by the heating unit of the bonding head to cure an adhesive applied between the image sensor and the PCB; and after the image sensor is mounted and the adhesive is cured, picking up a lens housing module by a lens housing module pickup unit and mounting the lens housing module on the PCB and attaching contact portions of the PCB to the lens housing module to complete the manufacture of a camera module.

6 Claims, 9 Drawing Sheets

NORMAL MODULE

DIE TILT

DIE TILT(PCB WARPAGE)

DIE TILT(PCB WARPAGE)

NORMAL

DEVIATION IN EPOXY
APPLICATION AMOUNT

DEVIATION IN EPOXY
APPLICATION POSITION

NORMAL

STAGE SETTING ERROR

TOOL SETTING ERROR

IMMEDIATELY AFTER D/A

PCB THERMALLY DEFORMED
(BEING CURED)

PCB RESTORATION
(CURING IS COMPLETED)

PCB RESTORATION
(CURING IS COMPLETED)

APPARATUS AND METHOD FOR MANUFACTURING CAMERA MODULE

CROSS REFERENCE(S) TO RELATED APPLICATIONS

This application claims the benefit under 35 U.S.C. Section 119 of Korean Patent Application Serial No. 10-2012-0050831, entitled "Apparatus and Method for Manufacturing Camera Module" filed on May 14, 2012, which is hereby incorporated by reference in its entirety into this application.

BACKGROUND OF THE INVENTION

1. Technical Field

The present invention relates to an apparatus and a method for manufacturing a camera module employed in a portable mobile communication device such as a mobile phone, or the like, and more particularly, to an apparatus and method for manufacturing a camera module capable of minimizing a tilt deviation between an image sensor and a lens housing module by making a mounting reference surface of the image sensor and that of the lens housing module the same spot (surface) to thus allow a mounting tilt of the image sensor to be simultaneously changed according to a tilt of a substrate (i.e., a printed circuit board (PCB)) when the lens housing is mounted on the substrate.

2. Description of the Related Art

Recently, the development of technologies of portable terminals such as mobile phones, personal digital assistants (PDAs), and the like, has promoted portable terminals to be used as multi-convergence devices supporting music, movie, TV, games, and the like, beyond the basic simple phone function thereof, and a camera module may be considered one of the most representative elements leading portable terminals toward multi-convergence. Camera modules have shifted from the conventional 300,000 pixel (VGA level) modules to the current high pixel modules based on 8 megapixels or higher, and are moving toward implementation of various additional functions such as autofocusing (AF), optical zoom, and the like.

In general, a compact camera module (CCM) is applied to portable mobile communication devices including a camera phone, a PDA, or a smart phone, and various other IT devices such as a toy camera, or the like. Recently, devices equipped with CCMs have increasingly been launched to meet consumers' diverse preferences.

Such camera modules, fabricated to include an image sensor such as a CCD, a CMOS, or the like, as a key component, concentrate light to form an image of an object through an image sensor, and store the same in a memory of the device. The stored data is displayed as an image through a display medium such as an LCD, a PC monitor, or the like, of the device.

General packaging schemes of an image sensor for a camera module include a flip-chip type chip on film (COF) scheme, a wire bonding type chip on board (COB) scheme, a chip scaled package (CSP) scheme, and the like, and among them, the COF package scheme and the COB package scheme are widely used.

The COB scheme is comprised of a dicing (wafer sawing) process, a die attach (D/A) process, a wire bonding (W/B) process, and a housing attach (H/A) process. Each process will be briefly described as follows.

Dicing process: Image sensors in a bare wafer state are fixedly attached to a tape of a wafer ring, and then, cut into individual unit image sensors by moving a blade made of diamond particles at particular positions of a corresponding pattern in X and Y directions while rotating the blade at a high speed.

D/A process: An epoxy is applied to a PCB, and, upon recognizing an image of the particular position pattern formed on the PCB, the individual unit image sensors severed during the dicing process are repeatedly attached to certain positions and cured.

W/B process: A gold wire is connected to pads of the image sensors and the pattern of the PCB by using a capillary such that they are electrically connected.

H/A process: An epoxy is applied to edges of the PCB with image sensors mounted thereon, and then, a lens-attached housing module is repeatedly attached at a certain position and cured.

Through the foregoing processes, a camera module is fabricated. A high pixel module having 12 megapixels has been developed based on the current technology, but currently, 5-mega pixel module is universally mass produced while a high pixel module having 8 megapixels is at the beginning stage of being mass produced. The existing 5-mega pixel camera module and the 8-megapixel camera module are developed to have the same standard in the overall size of the outer appearance. It is anticipated that the size of modules is reduced while the number of pixels continues to increase.

With the development of high pixel image sensors, the number of pixels of modules has increased during the same period, but a problem of resolving power occurs as the number of pixels is sharply increased. Namely, as shown in FIG. 1(a), ideal resolving power is obtained when a central axis of a lens 140 is 90° with respect to a surface of an image sensor 120 which receives light, and in this case, when the image sensor 120 tilts as shown in FIG. 1(b), resolving power of the entire screen or a particular corner is degraded, resulting in a degradation of resolving power of the entire screen. In FIG. 1, reference numeral 110 denotes a PCB, reference numeral 130 denotes an infrared blocking filter, and reference numeral 150 denotes a lens housing module, respectively.

The tilt of the image sensor degrading resolving power is caused by multiple factors according to flatness of the PCB, how an epoxy is applied (an epoxy application method), how much an epoxy is applied (an application amount of an epoxy), how the image sensor is mounted (a method of mounting the image sensor), a curing method, and the like, when an epoxy is applied to the PCB, the image sensor is mounted on the PCB, and curing is then performed during the D/A process.

RELATED ART DOCUMENT

Patent Document (Patent Document 1) Patent Laid Open Publication No. 10-2008-0032507

SUMMARY OF THE INVENTION

An object of the present invention is to provide an apparatus and method for manufacturing a camera module capable of minimizing a tilt deviation between an image sensor and a lens housing module by making a mounting reference surface of the image sensor and that of the lens housing module the same spot (surface) to thus allow a mounting tilt of the image sensor to be changed according to a tilt of a PCB when the lens housing module is mounted on the PCB.

According to an embodiment of the present invention, there is provided an apparatus for manufacturing a camera module using a die attach (D/A) method, including: a bonding head having a heating unit provided on a certain portion of a body thereof and picking up an image sensor and mounting the image sensor on a printed circuit board (PCB), applying heat by means of the heating unit to cure an adhesive applied (or coated) between the image sensor and the PCB; and a PCB support unit supporting the PCB from a lower side, having a PCB gyro unit provided on a certain portion of a body thereof, and compensating for a deviation between the PCB and the image sensor by the means of the gyro unit when the image sensor is picked up by the bonding head and mounted on the PCB.

The PCB may have a structure in which an image sensor mounting region is provided at a central portion thereof and a protrusion having a predetermined height is formed at outer edges of the region.

The protrusion may be formed to have a shape of '□' (i.e., a square or rectangular shape) along the outer edges of the image sensor mounting region.

The protrusion may be formed to have the same height as the height from a bottom surface of the PCB to an upper end portion of the image sensor in a state in which the image sensor is mounted on the PCB and the adhesive applied between the image sensor and the PCB is cured.

The heating unit provided on the bonding head may be an electric heater.

The PCB gyro unit provided on the PCB support unit may be any one of a ball type center gyro jig, a 4-ball pin jig, and a plate spring tension jig.

According to another embodiment of the present invention, there is provided a method for manufacturing a camera module by using a die attach (D/A) method by a camera module manufacturing apparatus including a bonding head having a heating unit and a printed circuit board (PCB) support unit having a PCB gyro unit, including: a) picking up an image sensor by the bonding head and mounting the image sensor on a PCB; b) compensating for a tilt deviation between the PCB and the image sensor by the gyro unit of the PCB support unit simultaneously when the image sensor is mounted on the PCB; c) applying heat by the heating unit of the bonding head to cure an adhesive applied between the image sensor and the PCB; and d) after the image sensor is mounted and the adhesive is cured, picking up a lens housing module by a lens housing module pickup unit and mounting the lens housing module on the PCB and attaching contact portions of the PCB to the lens housing module to complete manufacturing of a camera module.

In step a), when the image sensor is picked up by the bonding head and mounted on the PCB, with the image sensor picked up by the bonding head, an outer edge portion of the bonding head and an outer edge portion of the PCB may be brought into contact in a state of being maintained at a certain height, to thus primarily mechanically adjust the tilts of the PCB and the image sensor.

In step a), the PCB may have a structure in which an image sensor mounting region is provided at a central portion thereof and a protrusion having a predetermined height is formed at outer edges of the region.

The protrusion may be formed to have a square or rectangular shape along the outer edges of the image sensor mounting region.

The protrusion may be formed to have the same height as the height from a bottom surface of the PCB to an upper end portion of the image sensor in a state in which the image sensor is mounted on the PCB and the adhesive applied between the image sensor and the PCB is cured.

The heating unit provided on the bonding head may be an electric heater.

The PCB gyro unit provided on the PCB support unit may be any one of a ball type center gyro jig, a 4-ball pin jig, and a plate spring tension jig.

DESCRIPTION OF THE PREFERRED EMBODIMENTS

Terms and words used in the present specification and claims are not to be construed as a general or dictionary meaning, but are to be construed to meaning and concepts meeting the technical ideas of the present invention based on a principle that the inventors can appropriately define the concepts of terms in order to describe their own inventions in the best mode.

Throughout the present specification, unless explicitly described to the contrary, "comprising" any components will be understood to imply the inclusion of other elements rather than the exclusion of any other elements. A term "part", "module", "device", or the like, described in the specification means a unit of processing at least one function or operation and may be implemented by hardware or software or a combination of hardware and software.

Hereinafter, exemplary embodiments of the present invention will be described in detail with reference to the accompanying drawings.

Here, before describing an embodiment of the present invention, first, general matters or problems arising in a process of manufacturing a camera module by using a die attach (D/A) method will be described to help understand the present invention.

According to a D/A method in the process of manufacturing a camera module, first, a certain amount of epoxy is applied in a certain shape to a flat PCB and an individual unit image sensor obtained after performing dicing is picked up and mounted at a predetermined position upon recognizing a pattern formed on the PCB.

Here, the epoxy (a type of adhesive) used for mounting the image sensor is divided into a general epoxy and a film (DAF).

The general epoxy is an epoxy which is generally used, and an application position and an application amount of the epoxy are determined on the spot and applied by using a dispenser and a needle.

The film (DAF) is largely used for a stack die operation. A resin formed as a film is attached to a rear surface of a bare wafer and dicing is performed. After dicing, the image sensor and the film are cut to have a size of 1:1. Also, during the D/A process, the image sensor is immediately picked up and attached without a dispensing operation. Here, an application amount and an application thickness are determined depending on the specifications of the film.

The mounting-completed PCB (PCB+sensor) are subjected to a curing operation according to each process, and here, the curing operation is divided into two types of methods as follows.

1) Chamber Oven: This method is a general method used to manufacture a product by using an epoxy required to be cured for a long period of time.

2) Snap Cure Oven: This method is applied to a case of using an epoxy that can be cured at a low temperature for a short period of time, having an effect that a process lead time is shortened.

Meanwhile, in performing a D/A process by applying a general epoxy, a die tilt occurs due to the following problems.

1) PCB Flatness: PSR Coating, Pattern, Warpage

Figure 1A:
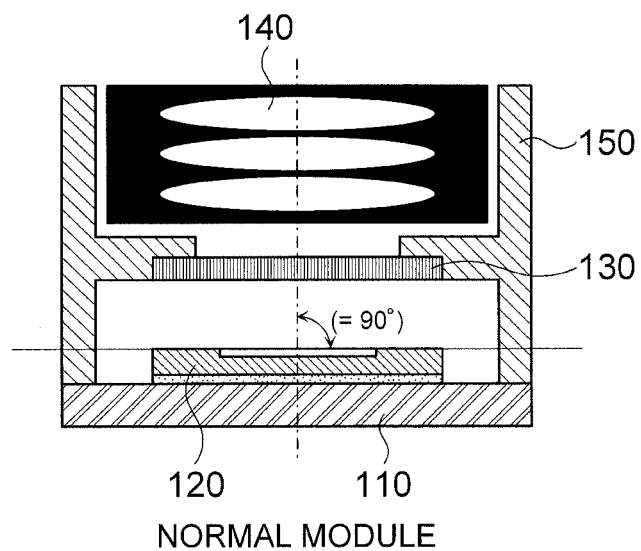
FIGS. 1A to 1B are views illustrating occurrence of a degradation of resolving power as an image sensor tilts while manufacturing a camera module.
Figure 1B:
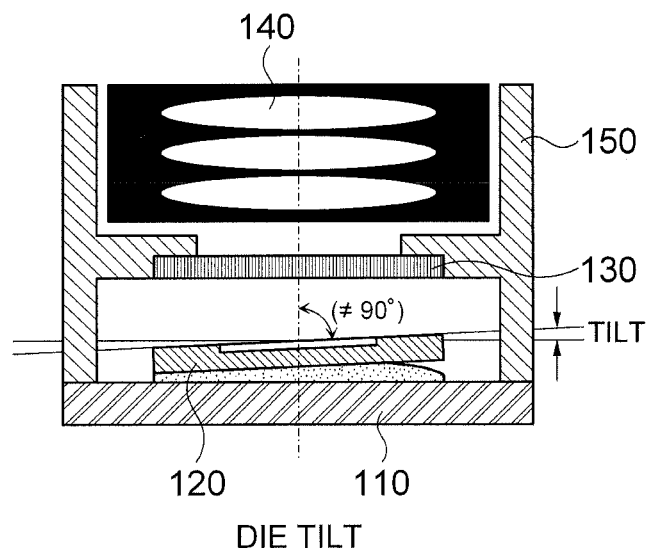
Figure 2A:
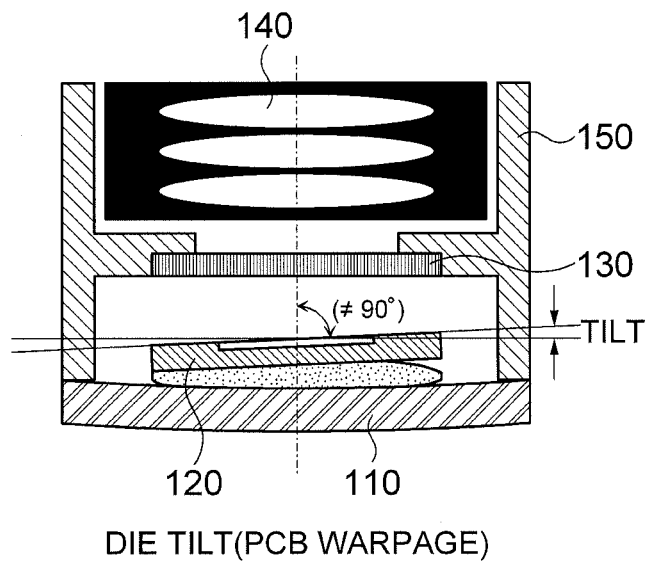
FIGS. 2A to 2B are views illustrating occurrence of a die tilt due to warpage of a PCB when a die attach (D/A) process is performed while manufacturing a camera module.
Figure 2B:
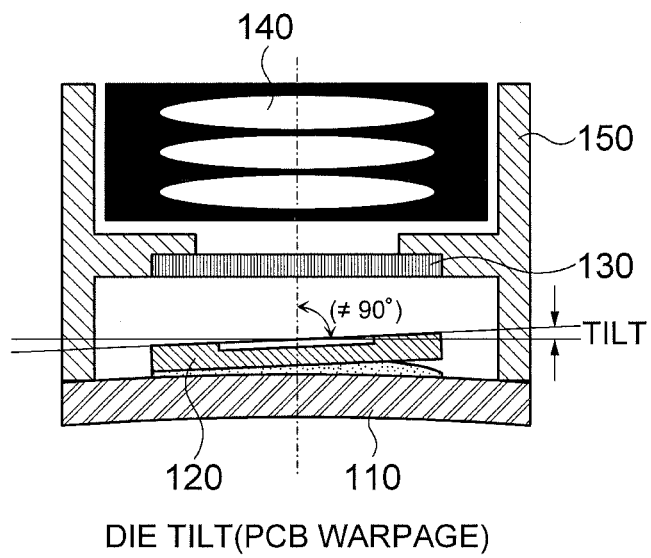

A general 'rigid PCB' is used as a basic raw material that corresponds to a D/A tilt quality. In order to facilitate a process operation, several units having the same pattern are arranged in X and Y directions and disposed on a rigid PCB configured as a sheet, the respective units are manufactured to be easily separated by using a routing method, and then, mounting is performed. Then, while passing through a high temperature reflow, the PCB 110 is warped as shown in FIGS. 2(a) and 2(b).

In order to prevent a generation of a short-circuit or a pattern damage at an exposed portion of the PCB pattern, a photo solder resist (PSR) having a certain thickness is applied, and here, the high and low is changed according to the presence or absence of a pattern portion, causing tilt.

2) Epoxy: Application Amount, Application Position Deviation

Figure 3A:
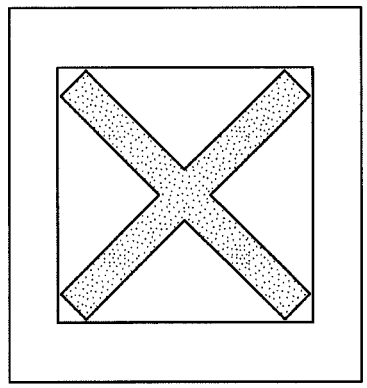
FIGS. 3A through 3C are views illustrating occurrence of a die tilt due to an application amount of an epoxy or a deviation of an application position when a D/A process is performed.
Figure 3B:
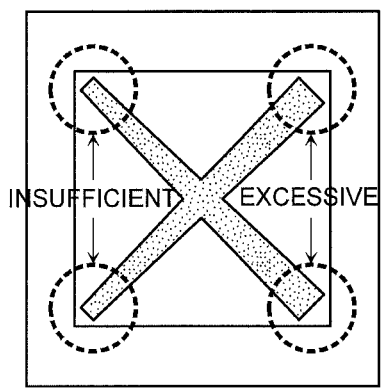

When an epoxy is applied, there is a deviation in the application amount of the epoxy, causing a tilt after the image sensor is attached as shown in FIG. 3(b).

Figure 3C:
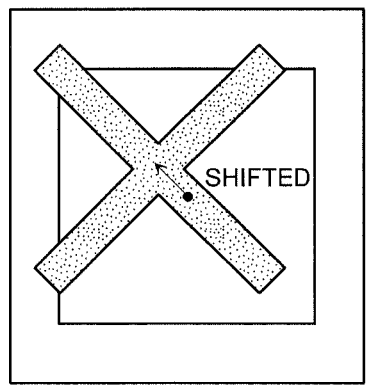

When the epoxy is applied, an application position of the epoxy is inclined to a particular position, causing a tilt after the image sensor is attached as shown in FIG. 3(c).

3) Bonding Quality: Flatness, Bonding Tool

Figure 4A:
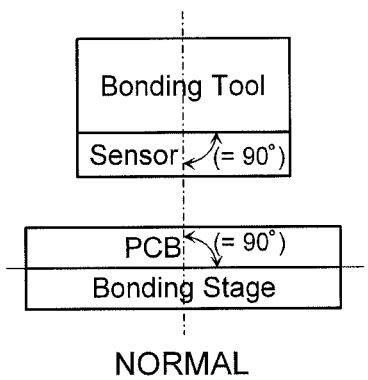
FIGS. 4A through 4C are views illustrating occurrence of a die tilt due to an error of a bonding stage or bonding tool setting when a D/A process is performed.
Figure 4B:
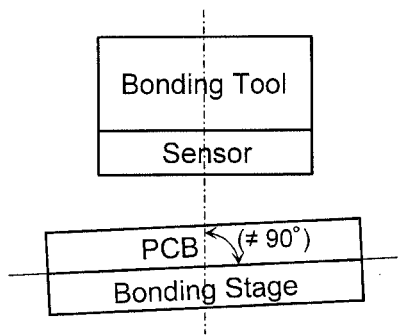

As shown in FIG. 4(b), tilting is generated due to the basic PCB incurring unevenness resulting from an error in bonding stage setting.

Figure 4C:
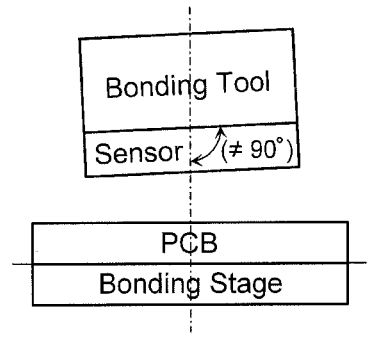

As shown in FIG. 4(c), tilting is generated due to a defect resulting from a bonding tool contamination and a setting error.

4) Curing: It is Difficult to Guarantee Flatness Based on Pre-Bonding and Post-Curing Process.

Figure 5A:
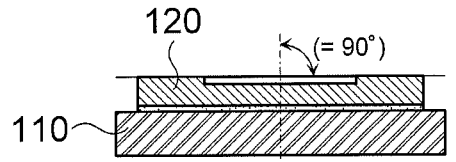
FIGS. 5A through 5C are views illustrating occurrence of a die tilt due to deformation of flatness of a PCB according to a pre-bonding and post-curing process when a D/A process is performed.
Figure 5B:
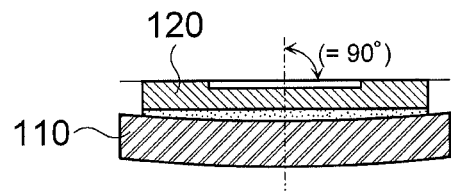
Figure 5C:
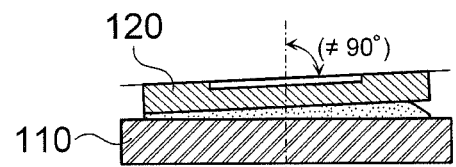
Figure 5C:
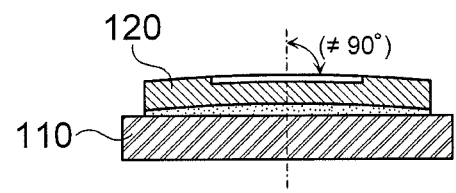

When the image sensor 120 is bonded to the PCB 110, although the bonding is accurately completed as shown in FIG. 5(a), since curing is separately performed as shown in FIGS. 5(b) and 5(c), it is difficult to guarantee the tilt of the sensor.

The PCB 110 is warped by heat during the curing operation and, in this state, curing proceeds, so it is difficult to guarantee the direction of a tilt of the image sensor 120 after the curing operation.

Based on the foregoing matters, the present invention will be described hereinafter.

The present invention is devised in consideration of the foregoing problems while manufacturing a camera module and directed to minimizing a tilt deviation between an image sensor and a lens housing module by making a mounting reference surface of the image sensor and that of the lens housing module the same spot (surface) to thus allow a mounting tilt of the image sensor to be simultaneously changed according to a tilt of the PCB when the lens housing module is mounted on the PCB.

Also, the present invention is directed to minimizing a tilt deviation between the image sensor and the lens housing module by picking up the image sensor by a bonding head and mounting it on the PCB and applying heat thereto to cure it.

Figure 6:
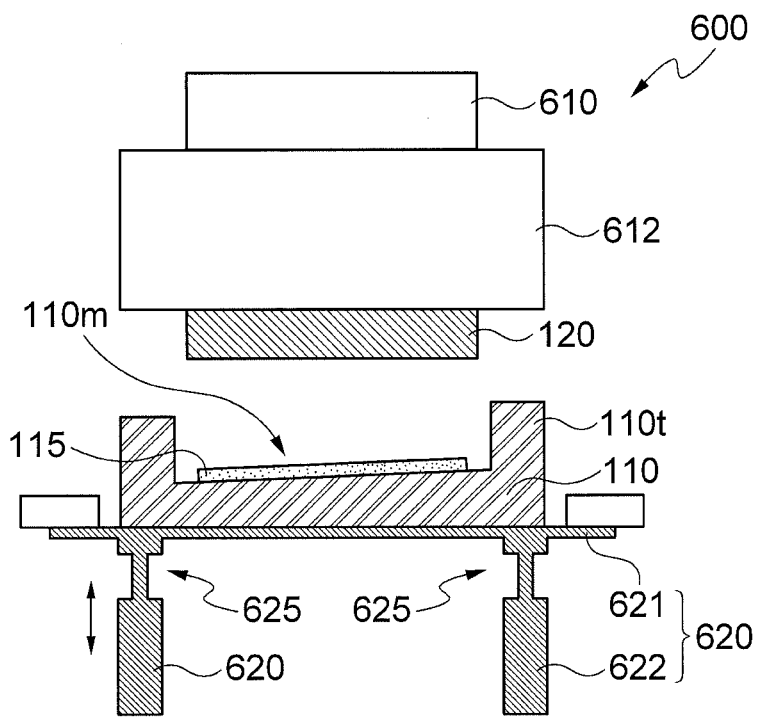
FIG. 6 is a view schematically illustrating the configuration of an apparatus for manufacturing a camera module according to an embodiment of the present invention.

FIG. 6 is a view schematically illustrating the configuration of an apparatus for manufacturing a camera module according to an embodiment of the present invention.

With reference to FIG. 6, the apparatus 600 for manufacturing a camera module according to an embodiment of the present invention is an apparatus for manufacturing a camera module using a die attach (D/A) method, and includes a bonding head 610 and a PCB support unit 620.

A heating unit 612 is provided on a certain portion of the body of the bonding head 610. The bonding head 610 picks up the image sensor 120, mounts the image sensor 120 on the PCB 110, and then applies heat by the heating unit 612 to cure an adhesive 115 applied between the image sensor 120 and the PCB 110.

The PCB support unit 620 supports the PCB 110 at the lower side and includes a horizontal member (a base jig) 621 supporting the entire lower surface portion of the PCB 110 and a vertical member 622 supporting the horizontal member 621 from a lower side. Also, a PCB gyro unit 625 is provided on a certain portion of the body of the PCB support unit 620. When the image sensor 120 picked up by the bonding head 610 is mounted on the PCB 110, the PCB support unit 620 compensates for a tilt deviation between the PCB 110 and the image sensor 120 by the gyro unit 625.

Here, preferably, the PCB 110 has a structure in which an image sensor mounting region 110m is formed at a central portion thereof and a protrusion 110t having a certain height is formed at outer edges of the region 110m.

Here, the protrusion 110t is formed to have a square or rectangular shape along the outer edges of the image sensor mounting region 110m.

Also, here, the protrusion 110t is formed to have the same height as the height from a bottom surface of the PCB 110 to an upper end portion of the image sensor 120 in a state in which the image sensor 120 is mounted on the PCB 110 and the adhesive 115 applied between the image sensor 120 and the PCB 110 is cured.

Also, as the heating unit 612 provided on the bonding head 610, an electric heater may be used.

Figure 7:
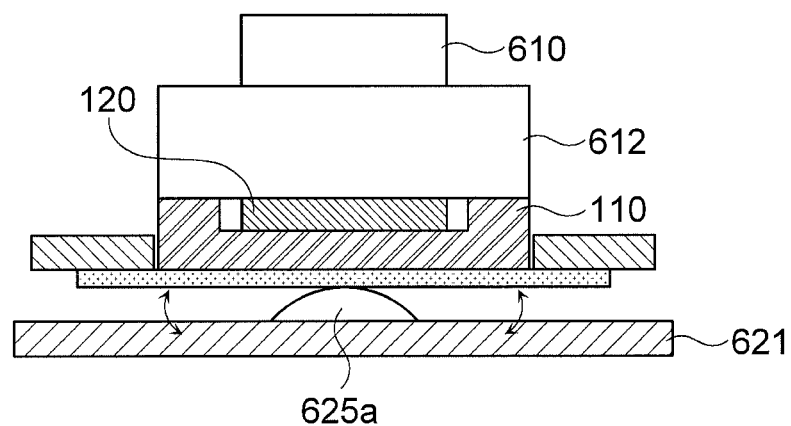
FIG. 7 is a view illustrating an example of a gyro unit employed in a PCB supporting unit of the apparatus for manufacturing a camera module according to an embodiment of the present invention.
Figure 8:
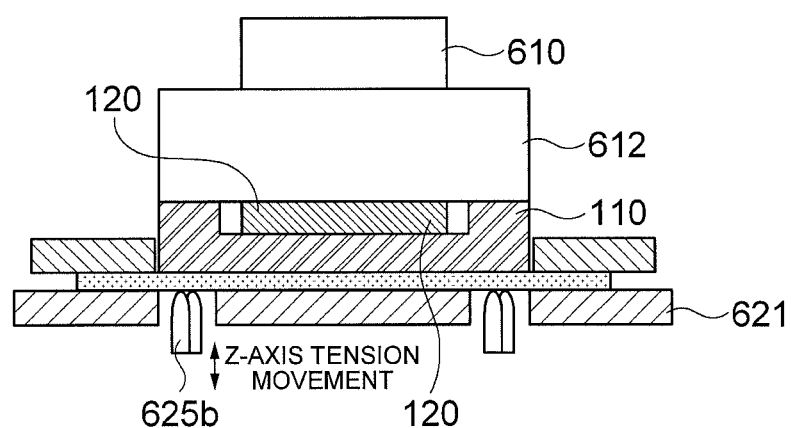
FIG. 8 is a view illustrating another example of a gyro unit employed in a PCB supporting unit of the apparatus for manufacturing a camera module according to an embodiment of the present invention.
Figure 9:
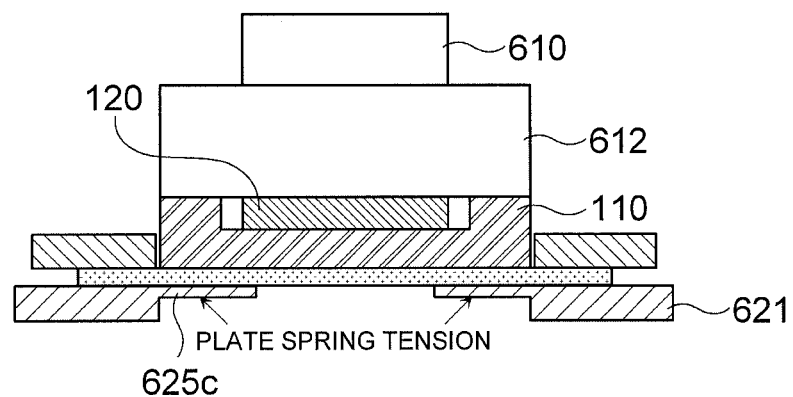
FIG. 9 is a view illustrating another example of a gyro unit employed in a PCB supporting unit of the apparatus for manufacturing a camera module according to an embodiment of the present invention.

Also, as the PCB gyro unit 625 provided on the PCB support unit 620, for example, a ball type center gyro jig 625a as illustrated in FIG. 7, a 4-ball pin jig 625b as illustrated in FIG. 8, a plate spring tension jig 625c as illustrated in FIG. 9, or the like, may be used.

Hereinafter, a method for manufacturing a camera module by the camera module manufacturing apparatus having the foregoing configuration will be described.

Figure 10:
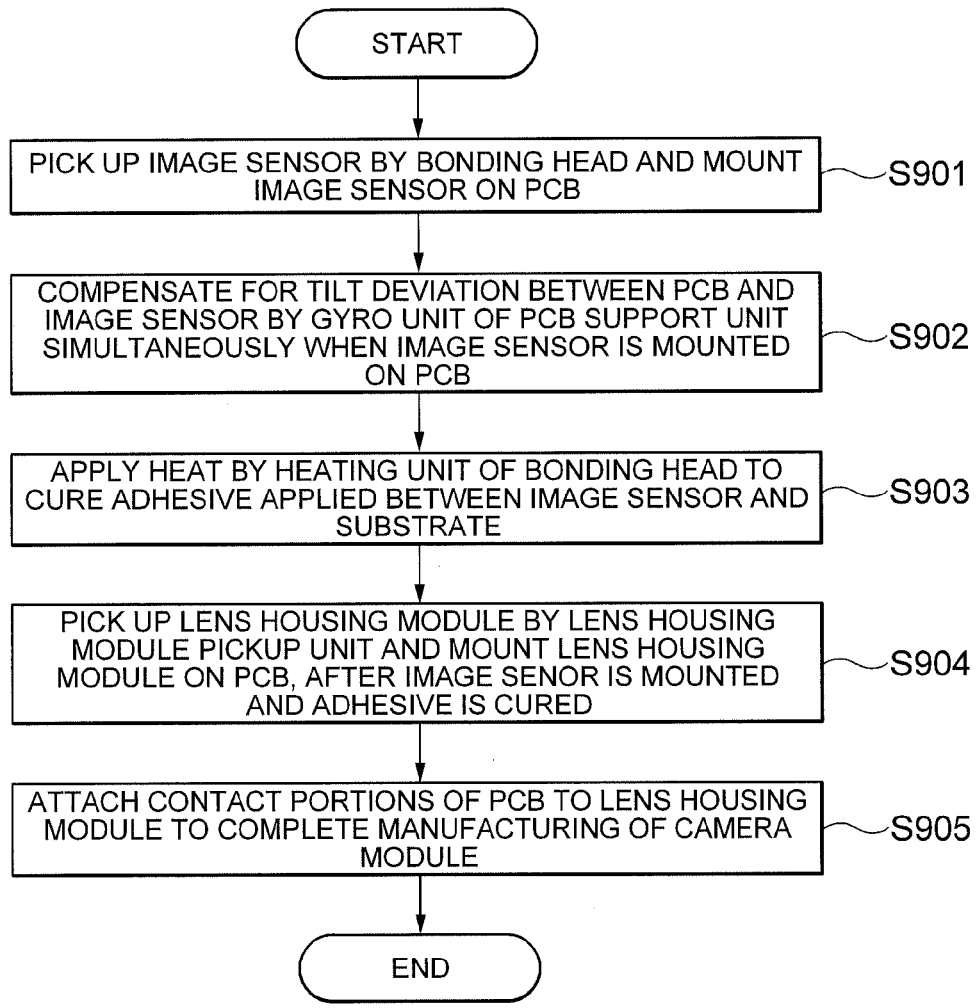
FIG. 10 is a flow chart illustrating a process of executing a method for manufacturing a camera module according to an embodiment of the present invention.

FIG. 10 is a flow chart illustrating a process of executing a method for manufacturing a camera module according to an embodiment of the present invention, and FIG. 11 is a view schematically showing each process of the method for manufacturing a camera module according to an embodiment of the present invention.

With reference to FIGS. 10 and 11, a method for manufacturing a camera module according to an embodiment of the present invention is a method of manufacturing a camera module by utilizing a D/A method in the camera module manufacturing apparatus including the bonding head 610 having the heating unit 612 and the PCB support unit 620 having the PCB gyro unit 625. First, the image sensor 120 is picked up by the bonding head 610 and mounted on the PCB 110 (S901).

Here, when the image sensor 120 is picked up by the bonding head 610 and mounted on the PCB 110, with the image sensor 120 picked up by the bonding head 610, an outer edge portion of the bonding head 610 (i.e., an edge portion of a lower surface of the bonding head 610) and an outer edge portion of the PCB 110 (i.e., an upper end surface of the protrusion 110t of the PCB 110) are brought into contact in a state of being maintained at a certain height, to thus primarily mechanically adjust the tilts of the PCB 110 and the image sensor 120.

Figure 11A:
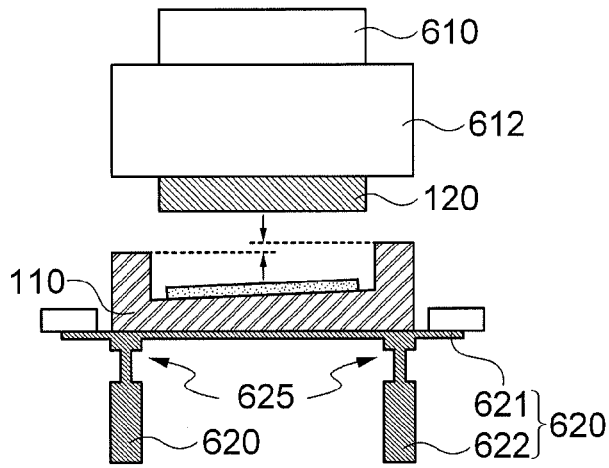
FIGS. 11A through 11D are views schematically showing each process of the method for manufacturing a camera module according to an embodiment of the present invention.
Figure 11B:
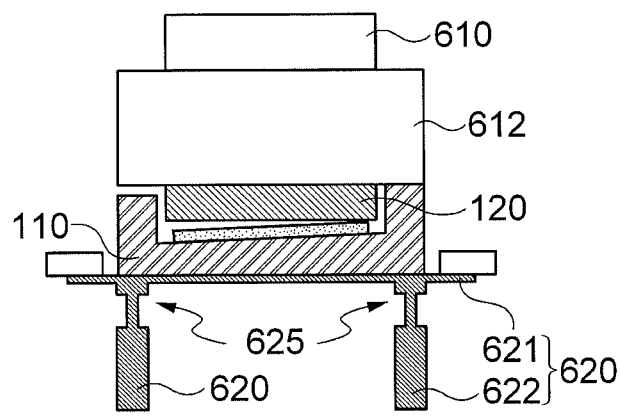
Figure 11C:
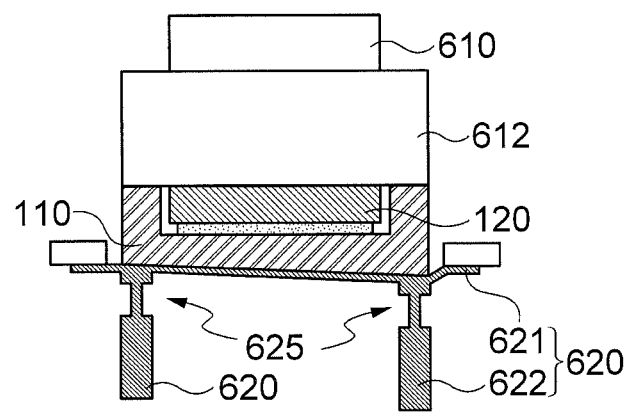
Figure 11D:
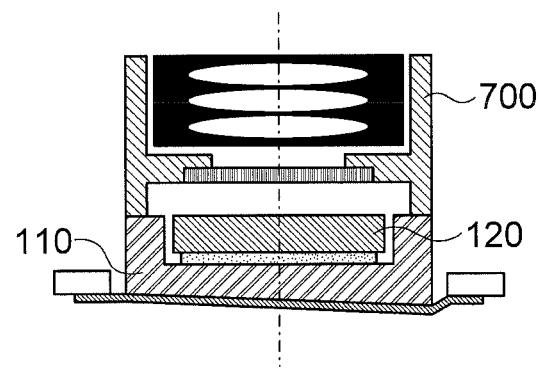

Also, immediately when the image sensor 120 is mounted on the PCB 110, a tilt deviation between the PCB 110 and the image sensor 120 is compensated by the gyro unit 625 of the PCB support unit 620 (S902). Namely, when there occurs a tilt between the image sensor 120 mounted on the PCB 110 and the PCB 110 due to unevenness of the flat PCB 110, non-uniformity of the adhesive 115 applied to the PCB 110, or the like, as shown in FIG. 11(b), a portion causing deviation (i.e., a right portion in FIG. 11(b)) is pressed by the bonding head 610 (or the heating unit 612 in the drawing). Accordingly, as shown in FIG. 11(c), the right vertical member 622 is tension-moved downwardly by the gyro unit 625 of the PCB support unit 620, and accordingly, the PCB 110 and the image sensor 120 are aligned based on the lower surface portion of the bonding head 610 (or the heating unit 612 in the drawing) as the same reference surface, and as a result, the foregoing tilt deviation is compensated for.

Thereafter, heat is applied by the heating unit 612 of the bonding head 610 to cure the adhesive 115 (See FIG. 6) applied between the image sensor 120 and the PCB 110 (S903). Here, simultaneously when the image sensor 120 is picked up by the bonding head 610 and mounted on the PCB 110, heat is applied to cure the adhesive 115, thereby minimizing a tilt (angle) deviation between the image sensor 120 and the lens housing module 700.

After the image sensor 120 is mounted and the adhesive 115 is cured, the lens housing module 700 is picked up by a lens housing module pickup unit (not shown) and mounted on the PCB 110 (S904), and then, contact portions of the PCB 110 and the lens housing module 700 are attached to each other by an adhesive, or the like, thus completing manufacturing of a camera module (S905).

Here, as described above, since the lens housing module 700 is mounted on the PCB 110 in a state in which the PCB 110 and the image sensor 120 are aligned based on the lower surface portion of the bonding head 610 (or the heating unit 612 in the drawing) as the same reference surface, a mounting reference surface of the image sensor 120 and that of the lens housing module 700 are the same. Thus, a mounting tilt of the image sensor 120 is changed together according to a tilt of the PCB 110 when the lens housing module 700 is mounted, and thus, a tilt (angle) deviation between the image sensor 120 and the lens housing module 700 can be minimized.

Meanwhile, in the foregoing sequential process, the PCB 110 has a structure in which the image sensor mounting region 110m (See FIG. 6) is provided at a central portion thereof and a protrusion 110t having a certain height is formed at the outer edges of the region 110m.

Here, the protrusion 110t is formed to have a square or rectangular shape along the outer edges of the image sensor mounting region 110m.

Also, here, the protrusion 110t is formed to have the same height as the height from a bottom surface of the PCB 110 to an upper end portion of the image sensor 120 in a state in which the image sensor 120 is mounted on the PCB 110 and the adhesive 115 applied between the image sensor 120 and the PCB 110 is cured.

Also, as the heating unit 612 provided on the bonding head 610, an electric heater may be used.

Also, as the PCB gyro unit 625 provided on the PCB support unit 620, for example, the ball type center gyro jig 625a, the 4-ball pin jig 625b, the plate spring tension jig 625c as illustrated in FIGS. 7 to 9, or the like, may be used.

As described above, with the apparatus and method for manufacturing a camera module according to an embodiment of the present invention, a mounting reference surface of the image sensor and the lens housing module is changed to have the same spot (surface) to make a mounting tilt of the image sensor changed together according to a tilt of the PCB when mounted, and also, simultaneously when the image sensor is picked up by the bonding head and mounted on the PCB, heat is applied to perform curing. Thus, a tilt (angle) deviation between the image sensor and the lens housing module can be minimized, and thus, a defective rate due to degradation of the resolution generated while manufacturing a camera module by using the D/A method can be reduced.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions, and substitutions should also be understood to fall within the scope of the present invention.

What is claimed is:

1. An apparatus for manufacturing a camera module using a die attach (D/A) method, the apparatus comprising;
   a bonding head having a heating unit provided on a certain portion of a body thereof and picking up an image sensor and mounting the image sensor on a printed circuit board (PCB), applying heat by means of the heating unit to cure an adhesive applied between the image sensor and the PCB; and
   a PCB support unit supporting the PCB from a lower side, having a PCB gyro unit provided on a certain portion of a body thereof, and compensating for a deviation between the PCB and the image sensor by means of the gyro unit when the image sensor is picked up by the bonding head and mounted on the PCB.

2. The apparatus according to claim 1, wherein the PCB has a structure in which an image sensor mounting region is provided at a central portion thereof and a protrusion having a predetermined height is formed at outer edges of the region.

3. The apparatus according to claim 2, wherein the protrusion is formed to have a square or rectangular shape along the outer edges of the image sensor mounting region.

4. The apparatus according to claim 2, wherein the protrusion is formed to have the same height as the height from a bottom surface of the PCB to an upper end portion of the image sensor in a state in which the image sensor is mounted on the PCB and the adhesive applied between the image sensor and the PCB is cured.

5. The apparatus according to claim 1, wherein the heating unit provided on the bonding head is an electric heater.

6. The apparatus according to claim 1, wherein the gyro unit provided on the PCB support unit is any one of a ball type center gyro jig, a 4-ball pin jig, and a plate spring tension jig.

* * * * *